(12) United States Patent
Scardera et al.

(10) Patent No.: US 9,306,088 B1
(45) Date of Patent: Apr. 5, 2016

(54) METHOD FOR MANUFACTURING BACK CONTACT SOLAR CELLS

(71) Applicant: E I DU PONT DE NEMOURS AND COMPANY, Wilmington, DE (US)

(72) Inventors: Giuseppe Scardera, Sunnyvale, CA (US); Shannon Dugan, Sunnyvale, CA (US)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 0 days.

(21) Appl. No.: 14/857,142

(22) Filed: Sep. 17, 2015

(51) Int. Cl.
*H01L 21/00* (2006.01)
*H01L 31/0224* (2006.01)
*H01L 31/18* (2006.01)

(52) U.S. Cl.
CPC ........ *H01L 31/022441* (2013.01); *H01L 31/18* (2013.01)

(58) Field of Classification Search
None
See application file for complete search history.

(56) References Cited

U.S. PATENT DOCUMENTS

| | | | |
|---|---|---|---|
| 8,858,843 | B2 | 10/2014 | Rogojina et al. |
| 9,048,374 | B1 * | 6/2015 | Scardera ............. H01L 31/0201 |
| 9,059,341 | B1 * | 6/2015 | Scardera ......... H01L 31/022441 |
| 2012/0280183 | A1 | 11/2012 | Kelman et al. |
| 2014/0065764 | A1 * | 3/2014 | Scardera ......... H01L 31/022441 438/98 |
| 2015/0140725 | A1 * | 5/2015 | Scardera ............. H01L 31/0201 438/98 |
| 2015/0187968 | A1 * | 7/2015 | Scardera ............. H01L 31/0201 438/98 |

OTHER PUBLICATIONS

Andreas Halm et al, "The zebra cell concept—large area N-type interdigitated back contact solar cells and one-cell modules fabricated using standard industrial processing equipment", 27th European Photovoltaic Solar Energy Conference and Exhibition, 2012, p. 567-570.
Ilkay Cesar et al, "Mercury: A back junction back contact front floating emitter cell with novel design for high efficiency and simplified processing", Energy Procedia 55, 2014, 633-642.

* cited by examiner

*Primary Examiner* — Jack Chen

(57) ABSTRACT

A method for manufacturing back contact solar cells, comprising steps of: (a) providing a silicon substrate doped with phosphorus; (b) doping the front surface and the rear surface of the substrate homogeneously with boron in a blanket pattern, thereby forming a front side p+ region on the front surface and a rear side p+ region on the rear surface; (c) forming a silicon dioxide layer on the front surface and the rear surface; (d) depositing a phosphorus-containing doping paste on the silicon dioxide layer of the rear surface in a second pattern; (e) heating the silicon substrate in order to locally diffuse phosphorus into the rear surface of the silicon substrate, thereby forming a rear side n+ region on the rear surface of the silicon substrate beneath the phosphorus-containing doping paste; and (f) removing the silicon dioxide layer from the silicon substrate.

12 Claims, 5 Drawing Sheets

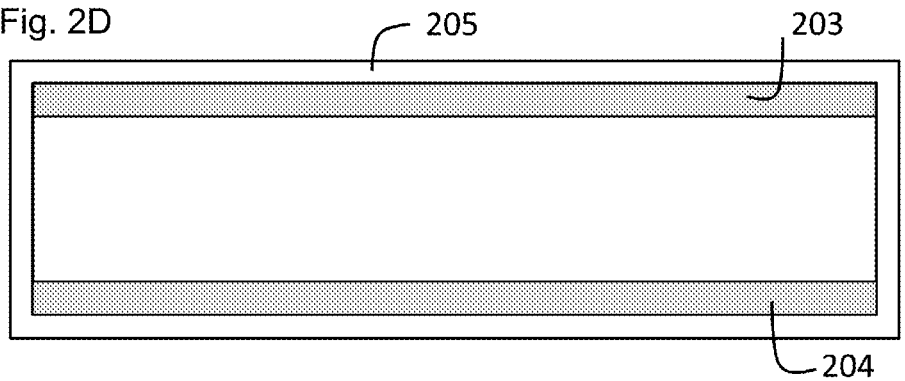
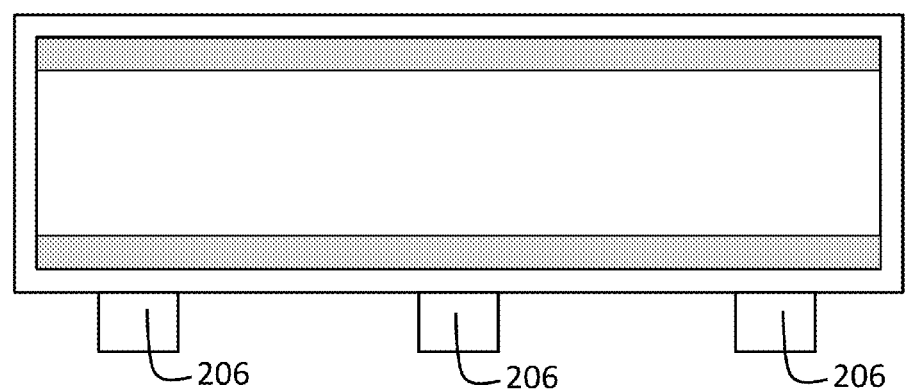
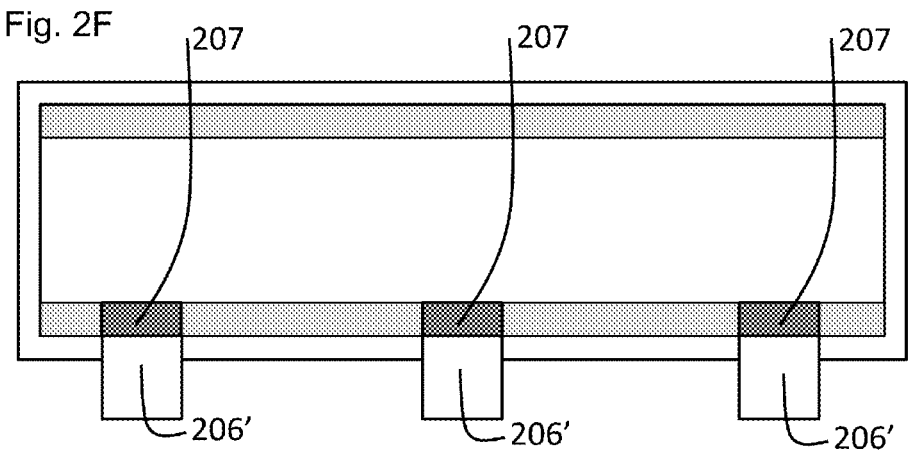

METHOD FOR MANUFACTURING BACK CONTACT SOLAR CELLS

FIELD OF THE INVENTION

This disclosure relates to back contact solar cells where an n+ diffused region and a p+ diffused region are formed on the rear side.

TECHNICAL BACKGROUND OF THE INVENTION

One approach to overcome the limitations of a conventional front-contacted solar cell is to move both the p-n junction and the back surface field (BSF) to the rear side of the solar cell. This architecture is called a back contact solar cell. By moving both the p-n junction and the BSF to the rear, all metallization required to extract generated carriers is also moved to the rear side. The front, sunward side is therefore free from shading losses, enabling higher short circuit current and thus efficiency. Another advantage of having metal contacts on the rear side is that the metal geometry is no longer constrained to minimize shading losses, allowing for wider metal contacts which reduce resistive losses. Having all metal contacts on the back side also has the added benefit of simplifying integration of solar cells into a module.

Various methods have been suggested with regard to the manufacturing process of back contact cells. Such methods are described in U.S. Pat. No. 9,048,374 directed to the manufacturing process of interdigitated back contact (IBC) solar cells; Andreas Halm et al, "The zebra cell concept—large area N-type interdigitated back contact solar cells and one-cell modules fabricated using standard industrial processing equipment", 27th European Photovoltaic Solar Energy Conference and Exhibition, page 567-570 (2012); and Ilkay Cesar et al, "Mercury: A back junction back contact front floating emitter cell with novel design for high efficiency and simplified processing" Energy Procedia 55 (2014) 633-642.

SUMMARY OF THE INVENTION

This invention describes a simplified method of forming a high efficiency back contact solar cell employing localized phosphorus diffused areas on the rear side achieved using a boron diffusion and a phosphorus-containing doping paste.

An aspect of the invention is a method for manufacturing back contact solar cells, comprising steps of: (a) providing a silicon substrate doped with phosphorus, the substrate comprising a front, sunward facing, surface and a rear surface; (b) subsequent to the step (a), doping the front surface and the rear surface of the substrate homogeneously with boron in a first pattern, thereby forming a front side p+ region on the front surface of the silicon substrate and a rear side p+ region on the rear surface of the silicon substrate, wherein the first pattern is a blanket pattern; (c) subsequent to the step (b), forming a silicon dioxide layer on the front surface and the rear surface; (d) subsequent to the step (c), depositing a phosphorus-containing doping paste on the silicon dioxide layer of the rear surface in a second pattern, wherein the phosphorus-containing doping paste comprising a phosphorus compound and a solvent; (e) subsequent to the step (d), heating the silicon substrate in a drive-in ambient to a drive-in temperature and for a drive-in time period in order to locally diffuse phosphorus into the rear surface of the silicon substrate, thereby forming a rear side n+ region on the rear surface of the silicon substrate beneath the phosphorus-containing doping paste; and (f) subsequent to the step (e), removing the silicon dioxide layer from the silicon substrate.

BRIEF DESCRIPTION OF THE DRAWINGS

FIG. 2D shows the $SiO_2$ formation step. FIG. 2E shows the printing step of the phosphorus-containing paste. FIG. 2F shows the phosphorus drive-in step.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
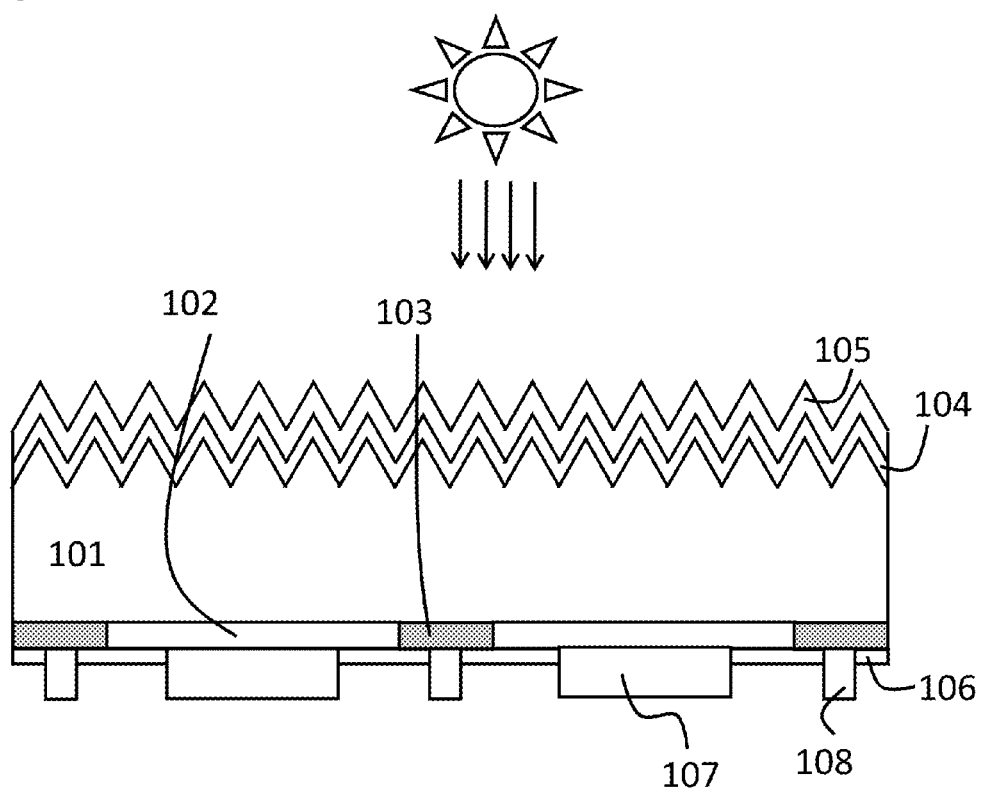
FIG. 1 shows a schematic view of an interdigitated back-contact (IBC) solar cell.

A schematic view of an interdigitated back-contact (IBC) solar cell is shown in FIG. 1. The IBC solar cell of FIG. 1 is an embodiment and the scope of the present invention is not limited to such IBC solar cell. In the embodiment of FIG. 1, a phosphorus doped, n, silicon substrate (101) is used as the absorber. A boron emitter or a rear side p+ region (102) is formed on the rear side of the cell to create the p-n junction required to separate carriers. A phosphorus BSF or a rear side n+ region (103) is also formed on the rear side of the solar cell. The boron and phosphorus doped regions on the rear side are formed in interdigitated patterns. A front side diffusion layer (104), doped with boron in an embodiment, is formed on the front, sunward side of the solar cell.

The front and rear surfaces are coated with a passivation film, shown as (105) and (106), respectively. Such a passivation film may comprise at least one of silicon nitride, aluminum oxide and silicon oxide. In some embodiments, the passivation film may be a stack structure comprising multiple, i.e. two or more layers. Such stack structure may include at least one layer comprising silicon nitride and at least one layer comprising one of silicon oxide and aluminum oxide. Boron emitter metal contacts (107) and phosphorus emitter metal contacts (108) are formed on the rear side in order to extract generated carriers.

An embodiment to fabricate an IBC solar cell is shown in FIGS. 2A to 2I.

Figure 2A:
FIG. 2A shows a silicon substrate.

The fabrication process may begin with providing a silicon substrate (201) doped with phosphorus (FIG. 2A). The substrate has a front, sunward facing, surface and a rear surface. The substrate is a textured (not shown) n-type silicon wafer in an embodiment.

The silicon wafer is then subjected to a boron doping process. The front surface and the rear surface of the silicon substrate are homogeneously doped with boron in a blanket pattern. Blanket doping pattern herein means that a dopant is entirely diffused into the surface of the substrate. By simultaneously doping the entire front surface of the substrate and the entire rear surface with boron in a single step, the manufacturing process of solar cells is simplified. Homogenous doping herein means the doping level is substantively the same for the entire doped area. Homogenous doping is an opposite concept to selective doping where different levels of doping is intentionally conducted, typically for cell efficiency reasons.

Figure 2B:
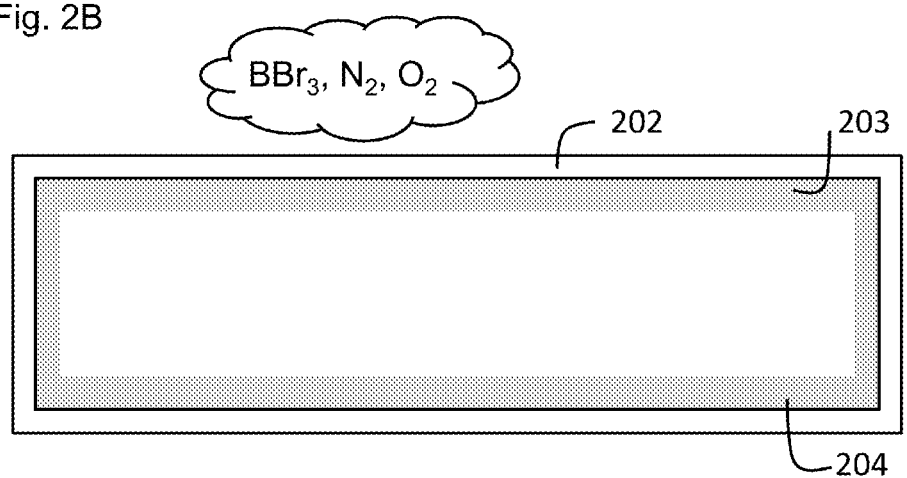
FIG. 2B shows the boron diffusion step.

Consequently, a front side p+ region (203) is formed on the front surface of the silicon substrate and a rear side p+ region (204) is formed on the rear surface of the silicon substrate. The side of the silicon substrate is doped with boron in an embodiment as illustrated in FIG. 2B. A borosilicate glass (BSG) layer (202) is also formed on top of these p+ regions in an embodiment. In the case of ion implantation, the BSG layer is typically not formed.

The boron doping process includes, but is not limited to, ion implantation of boron, $BBr_3$ diffusion, $BCl_3$ diffusion, and BSG deposition using chemical vapor deposition. In an embodiment, the substrate is exposed to a $BBr_3$-containing ambient such as an ambient comprising $BBr_3$, $N_2$ and $O_2$ as shown in FIG. 2B. In an embodiment, the substrate is placed in a heated quartz tube furnace, to which a $BBr_3$-containing ambient composed of $BBr_3$, $N_2$ and $O_2$ is supplied. The temperature of the BSG deposition process is 850° C. to 1000° C. in an embodiment. The time period of the BSG deposition process is 10 minutes to 2 hours in an embodiment.

Following the BSG deposition process, the substrate is subjected to a thermal drive-in step in an embodiment. A thermal drive-in process typically employs a heated quartz tube furnace with a drive-in ambient such as nitrogen, oxygen and mixture thereof. This high temperature drive-in step drives the boron atoms in the existing p+ regions (203 and 204) deeper into the wafer, thus creating a modified p+ layer. The temperature of the drive-in process is 850° C. to 1000° C. in an embodiment. The time period of the drive-in process is 10 minutes to 2 hours in an embodiment.

Figure 2C:
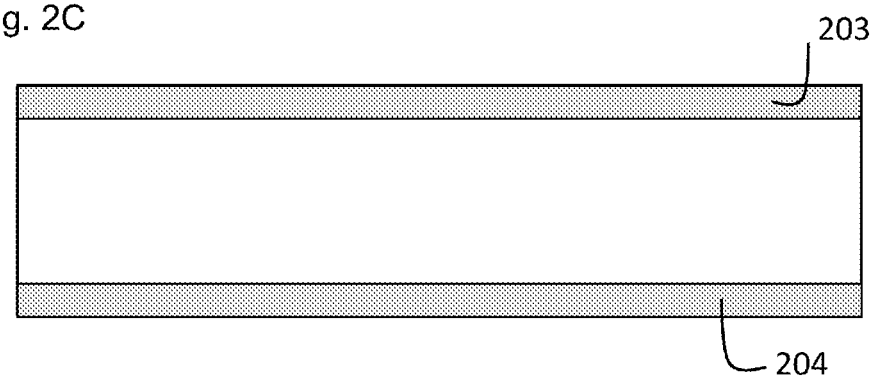
FIG. 2C shows the removal step of the BSG layer.

In an embodiment, the boron diffused regions on the edges of the wafer are removed using a plasma etch process. The silicon substrate is then subjected to a BSG layer stripping process in an embodiment, leaving behind boron-diffused regions (203) and (204) as shown in FIG. 2C. The BSG layer is removed by submerging the wafer in a dilute HF solution in an embodiment.

The wafer is then subjected to an oxidation process which grows a $SiO_2$ layer (205) on the surface of the wafer as shown in FIG. 2D. A thermal oxidation process may be used which typically employs a heated quartz tube furnace with an oxidizing ambient. This high temperature oxidation step will at the same time drive the boron atoms in the existing front side p+ layer (203 and 204) deeper into the wafer, thus creating a modified p+ layer.

The oxide layer (205) may be formed by a method selected from the group consisting of (i) thermal oxidation, (ii) depositing a liquid composition comprising silicon dioxide particles, (iii) chemical vapor deposition, (iv) chemical oxidation, (v) steam oxidation, (vi) printing and oxidizing a composition comprising of silicon particles, and (vii) growing and oxidizing a porous silicon layer. The thickness of the $SiO_2$ layer is 10 nm to 100 nm in an embodiment.

For the next step, shown in FIG. 2E, a phosphorus-containing paste (206) is deposited on the silicon dioxide layer of the rear surface. The phosphorus-containing paste is screen printed in an embodiment. The phosphorus-containing paste contains a phosphorus compound and a solvent in an embodiment. A low temperature bake is conducted in an embodiment in order to drive off solvents from the paste to form a patterned phosphorus-containing paste area. In an embodiment, the silicon dioxide layer does not contain any via or any through hole.

The printing pattern of the phosphorus-containing paste is not limited to a particular one. In an embodiment, the phosphorus-containing paste is deposited in a way that the boron and phosphorus doped regions collectively forms an interdigitated pattern.

The next step is a high temperature drive-in process. The silicon substrate is heated in a drive-in ambient to a drive-in temperature for a drive-in time period in order to locally diffuse phosphorus into the rear surface of the silicon substrate. The process is performed in a quartz tube furnace in an $N_2$ ambient in an embodiment. During this high temperature step, the phosphorus paste locally reacts with the $SiO_2$ layer forming new phosphorus source layers which reach the underlying silicon wafer and locally dope to form the phosphorus emitter or the rear side n+ region (207) on the rear surface of the silicon substrate beneath the phosphorus-containing doping paste as shown in FIG. 2F.

The drive-in temperature is 850° C. to 1000° C. in an embodiment. The drive-in time period is 20 minutes to 2 hours in an embodiment. The drive-in ambient is composed of nitrogen ($N_2$), oxygen ($O_2$) or mixture thereof in an embodiment.

This high temperature drive-in step can at the same time drive the boron atoms in the existing front side p+ layer (203) deeper into the wafer thus creating a modified p+ layer in an embodiment.

Figure 2G:
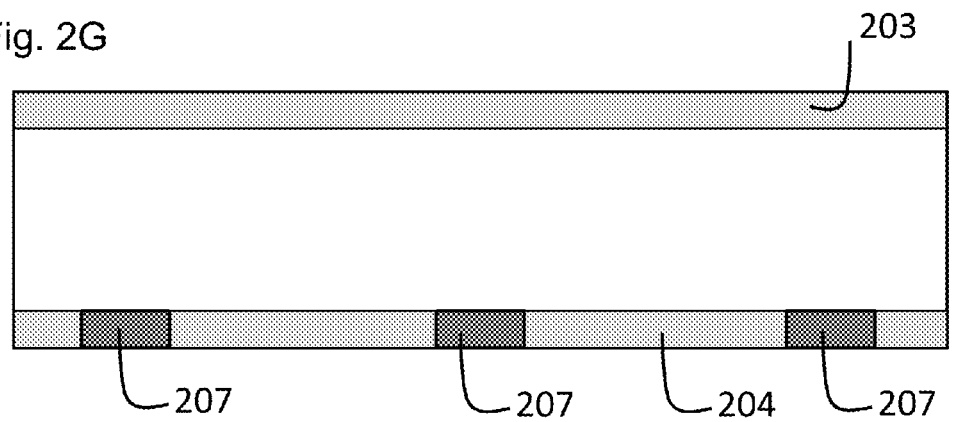
FIG. 2G shows the $SiO_2$ layer stripping step.

The next step is to remove the silicon dioxide layer from the silicon substrate and possibly residual paste layers, exposing the p+ layer (203) on the front side and the rear side p+ region (204) and the rear side n+ region (207) on the rear side as shown in FIG. 2G. The oxide layer can be removed by submerging the wafers in a dilute HF solution.

The rear side p+ region and the rear side n+ region on the rear surface collectively form an interdigitated pattern in an embodiment.

Figure 2H:
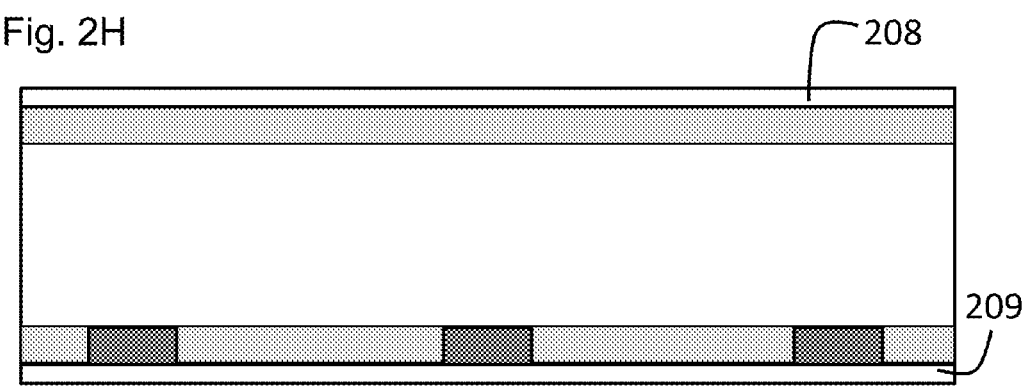
FIG. 2H shows the passivation step.

The front and rear surfaces are subsequently coated with passivation layers (208, 209), respectively, as shown in FIG. 2H. Such passivation films may comprise at least one of silicon nitride, aluminum oxide and silicon oxide. In some embodiments, the passivation film may be a stack structure comprising multiple, i.e. two or more layers. Such stack structure may include at least one layer comprising silicon nitride and at least one layer comprising one of silicon oxide and aluminum oxide. The passivation film may be prepared using a number of techniques. In some embodiments, the passivation film may be deposited using a chemical vapor deposition technique, such as plasma enhanced chemical vapor deposition (PECVD). Passivation films deposited on the back and front surfaces of the substrate may be the same or different.

Figure 2I:
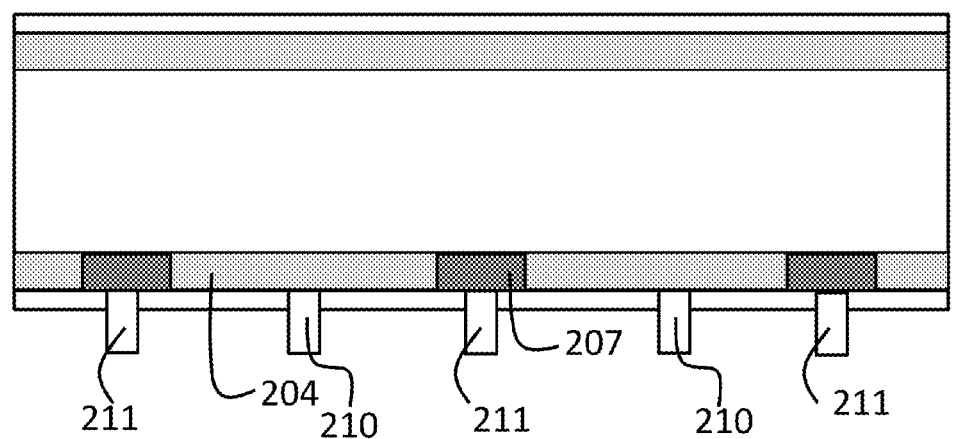
FIG. 2I shows the metallization (electrode-forming) step.

The next step is to form a first electrode (210) and a second electrode (211) on the rear surface. The first electrode (210) is in electric contact with the rear side p+ region (204) on the rear surface of the silicon substrate. The second electrode (211) is in electric contact with the rear side n+ region (207) on the rear surface of the silicon substrate, as shown in FIG. 2I. A process for forming the metal contacts (210, 211) is described below. However, the scope of the invention is not limited to the particular embodiment.

In one embodiment, two different metal compositions are used for the first electrode and the second electrode. In another embodiment, the same metal composition is used for both electrodes. In one embodiment, two metal compositions are deposited sequentially. In another embodiment, two metal compositions are deposited simultaneously. These metal contacts are deposited as patterns consisting of dots and/or lines.

Other modifications and improvements can be referred to. For example, US patent publication US2014-0065764, US patent publication US2012-0145967 and US patent publication US2012-0280183 are incorporated by reference in their entirety to the same extent as if they were individually incorporated by reference.

There are several methods of depositing the phosphorus-containing paste. Screen printing, in particular, is beneficial for the deposition of the paste since it is commonly used in solar cell manufacturing for the deposition of front and rear metal pastes. For better printing efficiency and performance, the paste is preferred to be a non-Newtonian or shear-thinning fluid.

Non-Newtonian fluid refers to a fluid that has flow properties that are not described by a single constant value of viscosity, or resistance to flow. Shear thinning refers to a fluid which has a viscosity that decreases with increasing rate of shear. In general, shear thinning behavior is observed in colloidal suspensions, where the weak hydrostatic and electrostatic interaction between particles and their surface groups tends to increase viscosity in non-dynamic force regimes. The addition of a relatively small shear force overcomes the hydrostatic interaction and thus tends to reduce the viscosity of the fluid.

Consequently, the viscosity of the paste is preferred to be relatively low at high shear rates in order to pass through a screen pattern, but is also preferred to be relatively high prior to and after deposition (at low or zero shear rates), such that the paste will not run through the screen or on the substrate surface, respectively.

Phosphorus-containing paste comprises a phosphorus compound; a polymer binder; a solvent; and optionally a ceramic compound in an embodiment.

The phosphorus compound includes, but not limited to, salts of linear phosphoric acids $H(O-PO(OH))_nOH$, where $n \geq 1$, and amount of substituent cations $X \leq n+2$; salts of cyclic phosphoric acids $(O-PO(OH))_n$, where $n \geq 3$, and amount of substituent cations $X \leq n$, mono- and di-substituted salts of phosphorus acid $HPO(OH)_2$, and salt of hypophosphorus acid $H_2PO(OH)$; and substituent cations X are ammonium, its organic derivatives, and metal cations, preferably Al, Ba, Ca, Ce, Mg, Hf, Ta, Ti, Zr, La.

The phosphorus compound is between 20 and 90 wt % in an embodiment, and between 40 and 70 wt % in another embodiment, based on the total weight of the paste.

A polymer binder may be included in the paste in order to optimize viscoelastic behavior of the paste for screen printing. The polymer binder includes, but is not limited to, polyacrylates, polymethacrylate, polyacetals and their derivatives (e.g. methyl, ethyl, butyl), polyvinyls, a cellulose (including its ethers and esters), and copolymers thereof. Two or more types of the polymer binder can be used in mixture.

The polymer binder is between 0.5 and 10 wt % in an embodiment, between 0.5 and 3 wt % in another embodiment, and between 0.75 and 2 wt % in still another embodiment, based on the total weight of the paste.

The component of the paste can be dispersed in a solvent, such as alcohols (e.g. terpineol), aldehydes, ketones (e.g. cyclohexanone), carboxylic acids, esters, amines, organosiloxanes, halogenated hydrocarbons, and other hydrocarbon solvents. In addition, the set of solvents may be mixed in order to optimize physical characteristics such as viscosity, density, polarity, etc.

A ceramic compound may be included in the paste. During the high temperature diffusion process, boron and phosphorus are allowed to diffuse into the substrate, while the diffusion of ambient materials may be blocked or substantially reduced by the ceramic material. In an embodiment, the ceramic compound is selected in terms of compatibility with the silicon substrate. Some of the oxide materials in contact with silicon at an elevated temperature may get reduced introducing impurities into the wafer.

The ceramic compound include, but not limited to, SiN, $SiO_2$, SiC, $TiO_2$, $Al_2O_3$, MgO, CaO, $Li_2O$, BeO, SrO, $Sc_2O_3$, $Y_2O_3$, $La_2O_3$, $CeO_2$, $Ce_2O_3$, $Pr_2O_3$, $Nd_2O_3$, $Sm_2O_3$, EuO, $Gd_2O_3$, $Ta_2O_5$, $Tb_2O_3$, $Dy_2O_3$, $Ho_2O_3$, $Er_2O_3$, $Tm_2O_3$, $Yb_2O_3$, $Lu_2O_3$, $ThO_2$, $UO_2$, $ZrO_2$ and $HfO_2$. In an embodiment, the ceramic compound is selected from the group consisting of silicon oxide ($SiO_2$) titanium oxide ($TiO_2$), aluminum oxide ($Al_2O_3$), magnesium oxide (MgO), tantalum oxide ($Ta_2O_5$), and zirconium oxide (ZrO2), and combinations thereof.

In an alternate configuration, the particle surface of the ceramic compound may be treated with a ligand or capping agent in order to disperse in a set of solvents and optimize shear thinning behavior. In general, a capping agent or ligand is a set of atoms or groups of atoms bound to a "central atom" in a polyatomic molecular entity. The capping agent is selected for some property or function not possessed by the underlying surface to which it may be attached.

The ceramic compound is between 0 and 50 wt % in an embodiment, between 3 and 40 wt % in another embodiment, 5 and 30 wt % in still another embodiment, based on the total weight of the paste.

For the purposes of this disclosure and unless otherwise specified, "a" or "an" means "one or more." All patents, applications, references and publications cited herein are incorporated by reference in their entirety to the same extent as if they were individually incorporated by reference.

The invention has been described with reference to various specific and illustrative embodiments. However, it should be understood that many variations and modifications may be made while remaining within the spirit and scope of the invention.

EXAMPLES

Experiment 1

Figure 3:
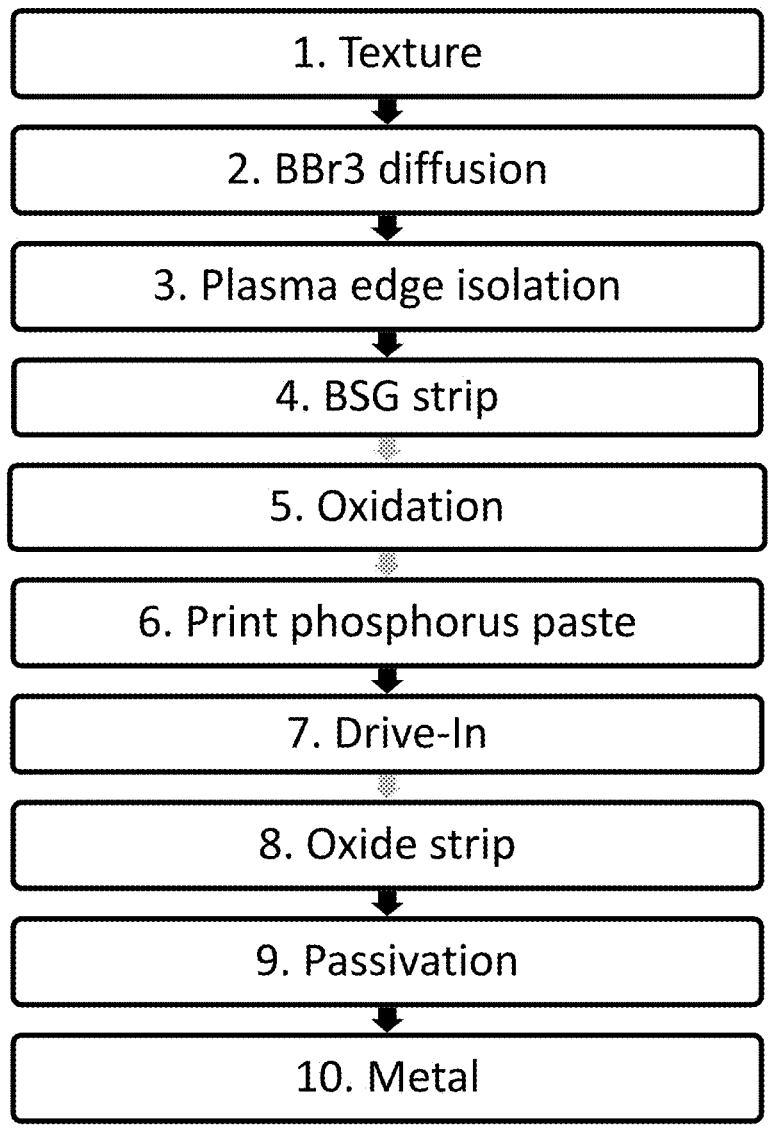
FIG. 3 shows a flow chart in Experiment 1.

FIG. 3 is a flow chart showing the process used in Experiment 1.

A set of 156 mm pseudo square, 180 micron thick, n-type, 5 Ohm-cm textured silicon wafers were loaded into a quartz tube furnace and subjected to a $BBr_3$, $N_2$ and $O_2$ ambient at 940° C. for 20 minutes as well as an additional 40 minutes at 960° C. in an $N_2$ ambient creating a boron diffused (p+) layer on all sides of the wafers. The first pattern for the p+ layer was a homogenously doped blanket pattern. The wafers were then coin-stacked and subjected to a plasma process in order to etch away the p+ diffused regions on the edges of the wafers. The wafers were then dipped in a dilute hydrofluoric acid and hydrochloric acid solution to remove the borosilicate glass (BSG) layer formed on the silicon wafer surface during the boron diffusion process. The wafers were subsequently oxidized in a quartz tube furnace at 855° C. in a wet oxidizing ambient for 60 minutes creating an oxide layer of approximately 50 nm on both sides of the wafer. The oxidized wafers were screen printed with a phosphorus-containing paste using a second pattern. Printed wafers were subsequently baked in air at 170° C. for approximately 1 minute.

Wafers were then loaded into a quartz tube furnace and subjected to a temperature of about 925° C. for 60 minutes in an $N_2$ ambient. The wafers were then dipped in a dilute hydrofluoric acid and hydrochloric acid solution to remove the oxide layer. Wafers were cleaned in a hot mixture of $H_2O_2$, HCl and water, followed by HF:HCl to remove any residual phosphorus-containing paste. Further, silicon dioxide and silicon nitride stacked passivation layers, about 2 nm and 80 nm thick, respectively, were deposited on the front and the rear side of the wafers.

Next, metal contacts were deposited on the rear side of the wafers. The widths of printed metal fingers were about 100 µm and 150 µm, respectively. Subsequently the wafers were fired in a belt firing furnace at a peak temperature of about 800° C. Next, a pattern of dielectric insulation material was double-printed onto the rear side of the wafer, followed by Ag paste busbars, which were aligned to the dielectric pattern. The role of the dielectric is to provide electrical insulation between the fingers and the busbars of the opposite polarity. Table 1 shows solar cell efficiency results, obtained under simulated AM1.5G spectrum.

TABLE 1

Measured efficiency from the lot of 8 solar cells.

| Condition | Voc (mV) | Jsc (mA/cm2) | FF (%) | Efficiency (%) |
|---|---|---|---|---|
| Best Cell | 640 | 40.0 | 77.6 | 19.8 |
| Average | 638 | 39.8 | 77.4 | 19.7 |
| Standard Deviation | 1.5 | 0.1 | 0.2 | 0.1 |

What is claimed is:

1. A method for manufacturing back contact solar cells, comprising steps of:
   (a) providing a silicon substrate doped with phosphorus, the substrate comprising a front, sunward facing, surface and a rear surface;
   (b) subsequent to the step (a), doping the front surface and the rear surface of the substrate homogeneously with boron in a first pattern, thereby forming a front side p+ region on the front surface of the silicon substrate and a rear side p+ region on the rear surface of the silicon substrate, wherein the first pattern is a blanket pattern;
   (c) subsequent to the step (b), forming a silicon dioxide layer on the front surface and the rear surface;
   (d) subsequent to the step (c), depositing a phosphorus-containing doping paste on the silicon dioxide layer of the rear surface in a second pattern, wherein the phosphorus-containing doping paste comprising a phosphorus compound and a solvent;
   (e) subsequent to the step (d), heating the silicon substrate in a drive-in ambient to a drive-in temperature and for a drive-in time period in order to locally diffuse phosphorus into the rear surface of the silicon substrate, thereby forming a rear side n+ region on the rear surface of the silicon substrate beneath the phosphorus-containing doping paste; and
   (f) subsequent to the step (e), removing the silicon dioxide layer from the silicon substrate.

2. A method of claim 1, wherein the front surface and the rear surface of the substrate is homogenously doped with boron in the step (b) by a process selected from the group consisting of ion implantation of boron, $BBr_3$ diffusion, $BCl_3$ diffusion, and BSG deposition using chemical vapor deposition.

3. A method of claim 2, wherein the front surface and the rear surface of the substrate is homogenously doped with boron in the step (b) by exposing the substrate to a $BBr_3$-containing ambient.

4. A method of claim 3, wherein the $BBr_3$-containing ambient comprises $BBr_3$, $N_2$ and $O_2$.

5. A method of claim 2, wherein a borosilicate glass (BSG) layer is formed on top of the p+ regions in the step (b) and wherein the BSG layer is stripped off prior to the step (c).

6. A method of claim 1, wherein the silicon dioxide layer is formed by a method selected from the group consisting of (i) thermal oxidation, (ii) depositing a liquid composition comprising silicon dioxide particles, (iii) chemical vapor deposition, (iv) chemical oxidation, (v) steam oxidation, (vi) printing and oxidizing a composition comprising of silicon particles, and (vii) growing and oxidizing a porous silicon layer.

7. A method of claim 1, wherein the thickness of the silicon dioxide layer is between 10 nm and 100 nm.

8. A method of claim 1, wherein the rear side p+ region and the rear side n+ region on the rear surface collectively form an interdigitated pattern.

9. A method of claim 1, further comprising steps of:
   (g) subsequent to the step (f), forming a passivation layer on both the front surface and the rear surface; and
   (h) subsequent to the step (g), forming a first electrode and a second electrode on the rear surface, wherein the first electrode is in electric contact with the rear side p+ region on the rear surface of the silicon substrate and wherein the second electrode is in electric contact with the rear side n+ region on the rear surface of the silicon substrate.

10. A method of claim 9, wherein the passivation layer comprises a first passivation layer and a second passivation layer formed on the first passivation layer, wherein the first passivation layer consists of silicon oxide or aluminum oxide and wherein the second passivation layer consists of silicon nitride.

11. A method of claim 9, wherein the first electrode and the second electrode are formed by screen printing and firing a paste containing silver powder.

12. A method of claim 1, wherein the drive-in temperature is 850-1000° C. and wherein the drive-in ambient is nitrogen, oxygen, or mixture thereof.

* * * * *